United States Patent
Liu et al.

(10) Patent No.: US 11,979,149 B2
(45) Date of Patent: May 7, 2024

(54) PHASE SELF-CORRECTION CIRCUIT

(71) Applicant: INSPUR SUZHOU INTELLIGENT TECHNOLOGY CO., LTD., Jiangsu (CN)

(72) Inventors: Jie Liu, Jiangsu (CN); Xu Wang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 161 days.

(21) Appl. No.: 17/786,345

(22) PCT Filed: Feb. 19, 2021

(86) PCT No.: PCT/CN2021/076934
§ 371 (c)(1),
(2) Date: Jun. 16, 2022

(87) PCT Pub. No.: WO2021/258751
PCT Pub. Date: Dec. 30, 2021

(65) Prior Publication Data
US 2023/0014527 A1    Jan. 19, 2023

(30) Foreign Application Priority Data
Jun. 24, 2020   (CN) .......................... 202010589269.3

(51) Int. Cl.
H03K 19/003    (2006.01)
H03K 5/00      (2006.01)
H03L 7/00      (2006.01)

(52) U.S. Cl.
CPC .............................. *H03K 19/00323* (2013.01)

(58) Field of Classification Search
None
See application file for complete search history.

(56) References Cited

U.S. PATENT DOCUMENTS 6,084,930 A * 7/2000 Dinteman ................. G06F 1/08
                                                   375/377
6,167,101 A   12/2000 Yang et al.
(Continued)

FOREIGN PATENT DOCUMENTS

CN        1697036         11/2005
CN      201054649          4/2008
(Continued)

OTHER PUBLICATIONS

International Search Report of corresponding PCT application (PCT/CN2021/076934) dated May 19, 2021, 5 pages.
(Continued)

*Primary Examiner* — Jany Richardson
(74) *Attorney, Agent, or Firm* — Cooper Legal Group LLC

(57) ABSTRACT

Provided is a phase self-correction circuit, including a trigger signal operation module and a signal phase correction module. The trigger signal operation module and the signal phase correction module are both composed of a plurality of discrete components. The trigger signal operation module is configured to perform a logical operation on an input phase standard reference signal and actual transmission signal, to obtain a target trigger signal for triggering the signal phase correction module; and the signal phase correction module is configured to output, based on trigger modes of the target trigger signal and the actual transmission signal, a self-correction transmission signal with the same waveform as that of the phase standard reference signal, to realize phase self-correction on the actual transmission signal.

13 Claims, 2 Drawing Sheets

(56) References Cited

U.S. PATENT DOCUMENTS

| | | | |
|---|---|---|---|
| 10,897,260 B2 | 1/2021 | Liu et al. | |
| 2012/0187994 A1* | 7/2012 | Yang | H03D 7/1458 |
| | | | 327/233 |
| 2017/0026033 A1* | 1/2017 | Yagoshi | H03K 5/24 |
| 2018/0091162 A1* | 3/2018 | Liu | H03L 7/099 |
| 2019/0171264 A1 | 6/2019 | Lakshman et al. | |

FOREIGN PATENT DOCUMENTS

| | | |
|---|---|---|
| CN | 106788353 | 5/2017 |
| CN | 206740856 | 12/2017 |
| CN | 107872223 | 4/2018 |
| CN | 108009112 | 5/2018 |
| CN | 108173545 | 6/2018 |
| CN | 110266294 A | 9/2019 |
| CN | 110324037 A | 10/2019 |
| CN | 111817701 A | 10/2020 |
| TW | 200939183 | 9/2009 |

OTHER PUBLICATIONS

Written Opinion of International Searching Authority of corresponding PCT application (PCT/CN2021/076934) dated May 19, 2021, 9 pages.

Corresponding Chinese Patent Application No. CN202010589269.3, Notification to Grant Patent Right, dated Oct. 10, 2022.

\* cited by examiner

PHASE SELF-CORRECTION CIRCUIT

This application claims priority to Chinese Patent Application No. CN202010589269.3, filed on Jun. 24, 2020 in China National Intellectual Property Administration and entitled "Phase Self-Correction Circuit", which is hereby incorporated by reference in its entirety.

TECHNICAL FIELD

The present application relates to the technical field of signal transmission, in particular to a phase self-correction circuit.

BACKGROUND ART

As known, the change in the magnitude of a phase of a signal usually reflects a physical change of the signal caused by an external interference in a transmission line. For example, with the interference caused by various external reasons such as electromagnetism, the phase of the signal will change accordingly, which may be possibly ahead or lag behind. The change of the phase usually brings chaos in timing, which is not conducive to stable signal transmission. It can be seen that it is very necessary to correct the changed phase or prevent phase changes to ensure stable signal transmission.

In the related art, reducing the routing length of a path, adding an electromagnetic shielding component, or performing package processing on signals prevents a phase from changing during the signal transmission, while limiting the routing length, enlarging a space for PCB (Printed Circuit Board) routing, and adding additional shielding measures will limit practical application scenarios and cause poor universality, cannot completely eliminate the change of the phase, and will also increase the additional manufacturing cost. In another related art, an integrated IC (Integrated Circuit) chip for clock reconstruction is added at a terminal, and the chip is used to perform signal reconstruction processing at the terminal to realize phase correction. The IC chips are expensive, which will increase the manufacturing cost of the entire circuit system.

In view of this, how to solve the problems of poor universality and high manufacturing cost in the related art is a technical problem to be solved by those skilled in the art.

SUMMARY

The present application provides a phase self-correction circuit, which realizes automatic correction for changes of the phase of a signal caused by various external reasons, to meet a timing requirement in a long-distance transmission scenario. The entire structure is simple, the universality is high, and the manufacturing cost is low.

In order to solve the above technical problems, an embodiment of the present invention provides the following technical solution.

An embodiment of the present invention provides a phase self-correction circuit, comprising a trigger signal operation module and a signal phase correction module, wherein the trigger signal operation module and the signal phase correction module are both composed of a plurality of discrete components.

Wherein the trigger signal operation module is configured to perform a logical operation on an input phase standard reference signal and actual transmission signal, to obtain a target trigger signal for triggering the signal phase correction module.

The signal phase correction module is configured to output, based on trigger modes of the target trigger signal and the actual transmission signal, a self-correction transmission signal with the same waveform as that of the phase standard reference signal, to realize phase self-correction on the actual transmission signal.

Optionally, the trigger signal operation module includes an exclusive-OR gate and an AND gate.

wherein a first input end of the exclusive-OR gate is connected to the phase standard reference signal, and a second input end of the exclusive-OR gate is connected to the actual transmission signal; a first input end of the AND gate is connected to an output end of the exclusive-OR gate, and a second input end of the AND gate is connected to the actual transmission signal; and an output end of the AND gate is connected to the signal phase correction module.

Optionally, the trigger signal operation module further includes a first voltage operational amplifier;

a positive electrode of the first voltage operational amplifier is connected to the actual transmission signal, and an output end of the first voltage operational amplifier is connected to the second input end of the AND gate, so as to input the actual transmission signal to the AND gate after the actual transmission signal is processed by the first voltage operational amplifier.

Optionally, the trigger signal operation module further includes a first capacitor and a second capacitor;

the phase standard reference signal is input to the first input end of the exclusive-OR gate via the first capacitor; and the actual transmission signal is input to the positive electrode of the first voltage operational amplifier via the second capacitor.

Optionally, the signal phase correction module includes a first switch transistor, a second switch transistor, and a voltage retention sub-module.

One end of the first switch transistor is connected to an output end of the trigger signal operation module; the other end of the first switch transistor is connected to the voltage retention sub-module; one end of the second switch transistor is connected to the actual transmission signal, and the other end of the second switch transistor is connected to the voltage retention sub-module.

The voltage retention sub-module is configured to adjust, based on the on and off states of the first switch transistor or the second switch transistor, an output voltage and a voltage of the phase standard reference signal to be consistent so that the waveform of the actual transmission signal is adjusted to be the same as that of the phase standard reference signal, and output the actual transmission signal.

Optionally, the first switch transistor and the second switch transistor are both N-type metal oxide semiconductor (NMOS) field-effect transistors.

Optionally, the voltage retention sub-module includes a third capacitor, a fourth capacitor, a second resistor, and a fourth resistor.

Two ends of the third capacitor are respectively connected to a source of the first switch transistor and one end of the fourth resistor; one end of the fourth capacitor is connected to a source of the second switch transistor and the fourth resistor; the other end of the fourth capacitor is grounded; and two ends of the second resistor are respectively connected to a drain of the second switch transistor and the trigger signal operation module.

A resistance value of the second resistor is determined based on a cycle of the phase standard reference signal or the actual transmission signal and a capacitance of the fourth capacitor, so that the total time of one discharge of the fourth capacitor is not less than the cycle value; and the resistance value of the fourth resistor is not greater than a preset resistance threshold.

Optionally, the signal phase correction module further includes a second voltage operational amplifier.

A negative electrode of the second voltage operational amplifier is connected to one end of the third capacitor and the source of the first switch transistor, and a positive electrode of the second voltage operational amplifier is connected to the source of the second switch transistor, the fourth capacitor, and the fourth resistor; and an output end of the second voltage operational amplifier is connected to the drain of the first switch transistor to serve as an output end to output the self-correction transmission signal.

Optionally, the signal phase correction module further includes a fifth capacitor for direct-current-blocking amplification.

One end of the fifth capacitor is connected to the third capacitor, the source of the first switch transistor, and the negative electrode of the second voltage operational amplifier, and the other end of the fifth capacitor is connected to the output end of the second voltage operational amplifier and the drain of the first switch transistor.

Optionally, the signal phase correction module further includes a first resistor and a third resistor.

One end of the first resistor is connected to the output end of the trigger signal operation module, and the other end of the first resistor is connected to a gate of the first switch transistor; and one end of the third resistor is connected to the input end of the trigger signal operation module, and the other end of the third resistor is connected to a gate of the second switch transistor.

The technical solution provided by the present application has the advantages: A trigger mode is determined based on the target trigger signal which is obtained by performing, by the trigger signal operation module, logical operation on the phase standard reference signal and the actual transmission signal after long-distance transmission, and the actual transmission signal, and the waveform of the actual transmission signal is adjusted, based on the trigger mode, to be consistent with that of the phase standard reference signal, to realize the automatic correction of the change of the phase of the signal caused by various external reasons; the timing requirement in a long-distance transmission scenario is met; the entire structure is simple; and the reliability is high. Since the phase self-correction circuit is composed of multiple discrete semiconductor components, these discrete components are cheaper than an IC chip, and the manufacturing cost of the entire phase self-correction circuit is much lower than that of the IC chip; and the self-correction circuit has no requirements for application scenarios, so that the universality is high.

It should be understood that the above general description and the following detailed description are exemplary only, and are not intended to limit the present disclosure.

BRIEF DESCRIPTION OF THE DRAWINGS

In order to describe the embodiments of the present invention or the technical solutions in the related art more clearly, drawings required to be used in the embodiments or the illustration of the related art will be briefly introduced below. Obviously, the drawings in the illustration below are only some embodiments of the present invention. Those ordinarily skilled in the art also can acquire other drawings according to the provided drawings without creative work.

DETAILED DESCRIPTION

In order to enable those skilled in the art to better understand the solution of the present invention, the present invention will be further described in detail below with reference to the accompanying drawings and specific embodiments. Apparently, the described embodiments are only a part of the embodiments of the present invention, rather than all the embodiments. Based on the embodiments of the present invention, all other embodiments obtained by those skilled in the art without creative work shall fall within the protection scope of the present invention.

The terms "first", "second", "third", "fourth", etc. in the specification and claims of the present application and the above drawings are used to distinguish different objects, and are not intended to describe a specific order.

In addition, the terms "include" and "comprise" and any variations of them are intended to cover non-exclusive inclusions. For example, a process, method, system, product or device comprising a series of steps or units is not limited to the listed steps or units, but may include unlisted steps or units.

After introducing the technical solutions of the embodiments of the present invention, various non-limiting implementations of the present application are described in detail below.

Figure 1:
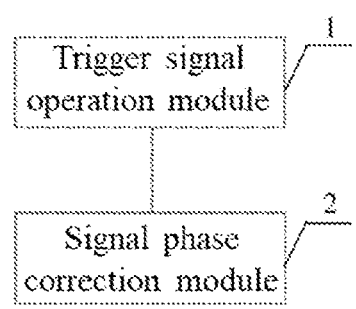
FIG. 1 is a schematic structural block diagram of one implementation of a phase self-correction circuit provided by an embodiment of the present invention.
Figure 2:
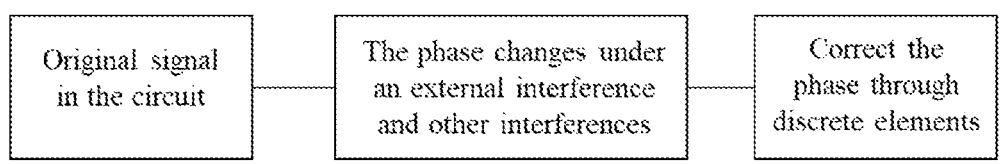
FIG. 2 is a schematic diagram of a phase self-correction principle provided by an embodiment of the present invention.

First referring to FIG. 1 and FIG. 2, FIG. 1 is a flow chart of a phase self-correction circuit method provided by an embodiment of the present invention. The embodiment of the present invention may include the following content.

A phase self-correction circuit may include a trigger signal operation module 1 and a signal phase correction module 2. The trigger signal operation module 1 and the signal phase correction module 2 are both composed of a plurality of discrete components. An input of the trigger signal operation module 1 is a phase standard reference signal and an actual transmission signal. The phase standard reference signal is a standard signal, the phase of which does not change after a signal to be transmitted is subjected to long-distance transmission. The actual transmission signal is an actual signal which is output after a signal to be transmitted is subjected to long-distance transmission, the phase of which changes. An output of the trigger signal operation module 1 is a target trigger signal. An input of the signal phase correction module 2 is the target trigger signal and the actual transmission signal, and an output is a phase-corrected actual transmission signal. That is, the phase self-correction circuit is configured to process the actual transmission signal via the trigger signal operation module 1 and the signal phase correction module 2 and output a signal with the same waveform as that of the phase standard reference signal, thus realizing phase self-correction on the actual transmission signal. In the schematic diagram of a realizing principle as shown in FIG. 2, an original signal in FIG. 2 is the actual transmission signal.

The trigger signal operation module 1 may be configured to perform a logical operation on the input phase standard reference signal and actual transmission signal, to obtain the target trigger signal for triggering the signal phase correction module 2. The logical operation may be, for example, logical AND operation, exclusive-OR operation, and the like. A discrete component for realizing the corresponding logical operation is selected based on the logical operation to be performed. The logical operation is performed on the phase standard reference signal and the actual transmission signal to obtain the target trigger signal. If the waveform of the target trigger signal is different, a line for triggering the signal phase correction module 2 to finally output a signal is different.

The signal phase correction module 2 may be configured to output, based on trigger modes of the target trigger signal and the actual transmission signal, a self-correction transmission signal with the same waveform as that of the phase standard reference signal, to realize phase self-correction on the actual transmission signal. The signal phase correction module 2 may include a plurality of discrete components which realize, based on different waves, turning off or turning on, such as a switch transistor. The target trigger signal and the actual transmission signal jointly determine which component is turned off and which component is turned on. A subsequent signal flow direction for turning on is modulated via the discrete components, so that the waveform of the finally output actual transmission signal is the same as that of the phase standard reference signal.

In the technical solution provided by the embodiment of the present invention, a trigger mode is determined based on the target trigger signal which is obtained by performing, by the trigger signal operation module, logical operation on the phase standard reference signal and the actual transmission signal after long-distance transmission, and the actual transmission signal, and the waveform of the actual transmission signal is adjusted, based on the trigger mode, to be consistent with that of the phase standard reference signal, to realize the automatic correction of the change of the phase of the signal caused by various external reasons; the timing requirement in a long-distance transmission scenario is met; the entire structure is simple; and the reliability is high. Since the phase self-correction circuit is composed of multiple discrete semiconductor components, these discrete components are cheaper than an IC chip, and the manufacturing cost of the entire phase self-correction circuit is much lower than that of the IC chip; and the self-correction circuit has no requirements for application scenarios, so that the universality is high.

Figure 3:
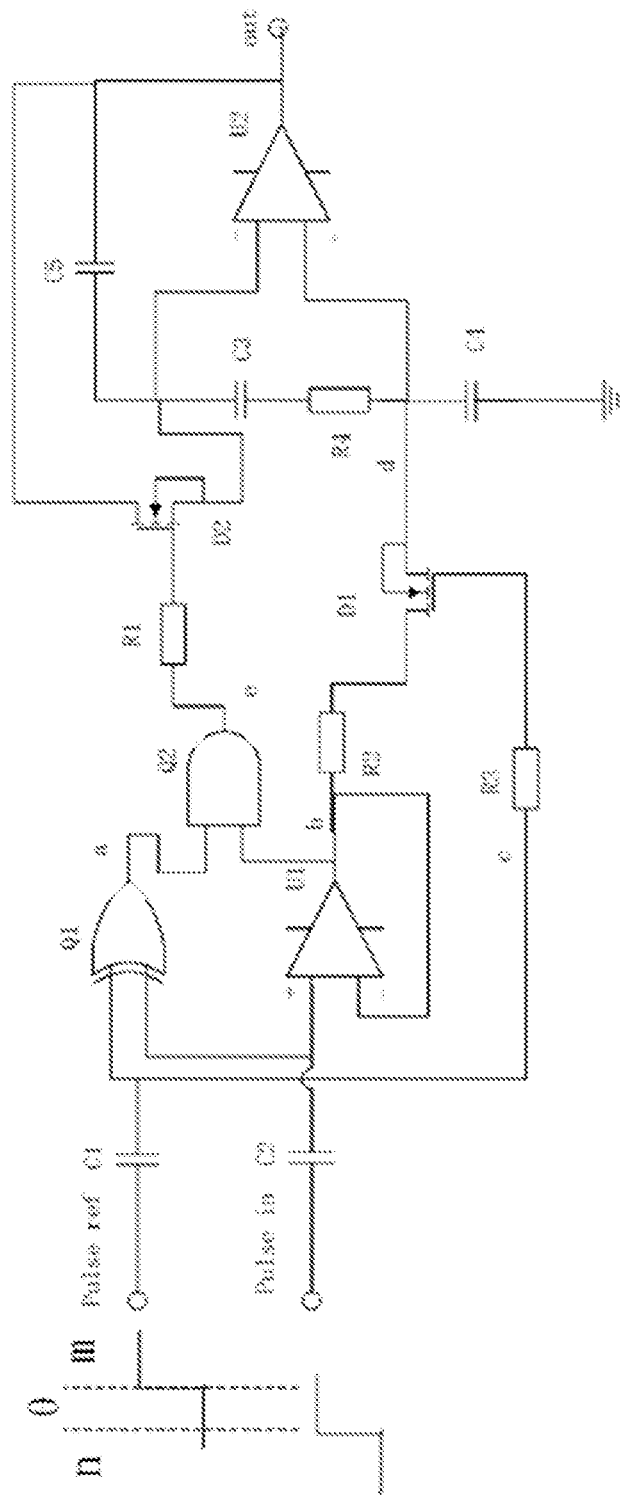
FIG. 3 is a schematic structural diagram of another implementation of a phase self-correction circuit provided by an embodiment of the present invention.

In the above embodiment, the structural constitutions of the trigger signal operation module and the signal phase correction module are not limited. In this embodiment, the structural constitutions of the trigger signal operation module and the signal phase correction module under one implementation are provided. As shown in FIG. 3, Pulse ref of FIG. 3 is a normal phase standard reference signal; Pulse in is an actual transmission signal, the phase of which changes after long-distance transmission; a phase difference between the actual transmission signal and the phase standard reference signal is θ which may be greater than 0 or less than 0. θ shown in FIG. 3 is greater than 0, that is, the phase of the signal lags behind the phase of the normal reference signal. The following content may be included.

The discrete components of the trigger signal operation module 1 for realizing the logical operation include an exclusive-OR gate Q1 and an AND gate Q2. The exclusive-OR gate Q1 outputs 1 for inputs with the same waveforms and phases and outputs 0 for inputs with different phases. The AND gate Q2 outputs 1 for inputs with the same waveforms and phases and outputs 0 for inputs with different phases. A first input end of the exclusive-OR gate Q1 is connected to the phase standard reference signal, and a second input end of the exclusive-OR gate Q1 is connected to the actual transmission signal; a first input end of the AND gate Q2 is connected to an output end of the exclusive-OR gate Q1, and a second input end of the AND gate Q2 is connected to the actual transmission signal; and an output end of the AND gate Q2 is connected to the signal phase correction module 2.

As one optional implementation, in order to achieve a voltage follow-up effect, the actual transmission signal is a low output impedance before it is input to the AND gate Q2. The trigger signal operation module 1 may further include a first voltage operational amplifier U1. A positive electrode of the first voltage operational amplifier U1 is connected to the actual transmission signal, and an output end of the first voltage operational amplifier U1 is connected to the second input end of the AND gate Q2, to input the actual transmission signal to the AND gate Q2 after the actual transmission signal is processed by the first voltage operational amplifier.

As another optional implementation mode, in order to ensure the inputting of the two paths of pure pulse signals: the phase standard reference signal and the actual transmission signal, a bias direct-current voltage introduced from the outside to the pulse is filtered out. The trigger signal operation module 1 may further include a first capacitor C1 and a second capacitor C2, for example. The phase standard reference signal is input to the first input end of the exclusive-OR gate Q1 via the first capacitor C1; and the actual transmission signal is input to the positive electrode of the first voltage operational amplifier U1 via the second capacitor C2.

In the embodiment of the present invention, the discrete components in the signal phase correction module 2 for realizing turning on or turning off may include a first switch transistor D1 and a second switch transistor D2. The first switch transistor D1 and the second switch transistor D2 are NMOS field-effect transistors, for example. Of course, the first switch transistor D1 and the second switch transistor D2 may also be other components for realizing turning on and turning off functions, such as triodes. All of them will not affect the implementation of the present application. One end of the first switch transistor D1 is connected to the output end of the trigger signal operation module 1, such as the output end of the AND gate Q2 as shown in FIG. 3; the other end of the first switch transistor is connected to the voltage retention sub-module; and one end of the second switch transistor D2 is connected to the actual transmission signal, and the other end of the second switch transistor D2 is connected to the voltage retention sub-module; the voltage retention sub-module may be configured to adjust, based on on and off states of the first switch transistor D1 or the second switch transistor D2, an output voltage and a voltage of the phase standard reference signal to be consistent so that the waveform of the actual transmission signal is adjusted to be the same as that of the phase standard reference signal, and output the actual transmission signal.

In some implementations of the embodiment of the present invention, the voltage retention sub-module may include a third capacitor C3, a fourth capacitor C4, a second resistor R2, and a fourth resistor R4. The first switch transistor D1 and the second switch transistor D2 are, for example, the NMOS field-effect transistors, and are taken as an example to describe connection relations between all the components. Two ends of the third capacitor C3 are respectively connected to a source of the first switch transistor D1 and one end of the fourth resistor; one end of the fourth capacitor C4 is connected to a source of the second switch transistor D2 and the fourth resistor R4; the other end of the fourth capacitor C4 is grounded; and two ends of the second resistor R2 are respectively connected to a drain of the second switch transistor D2 and the output end of the first voltage operational amplifier U1 of the trigger signal operation module 1. A resistance value of the second resistor R2 is determined based on a cycle of the phase standard reference signal or the actual transmission signal and a capacitance of the fourth capacitor C4, so that the total time of one discharge of the fourth capacitor C4 is not less than the cycle value; and the resistance value of the fourth resistor R4 is not greater than a preset resistance threshold, so that the fourth capacitor C4 quickly changes to 0 during discharging.

The self-correction principle for the actual output signal based on the structures of the above trigger signal operation module and the signal phase correction module is as follows.

When θ is greater than 0, during the period m, pulse ref and pulse in are both at high level 1, the two signals pass through the exclusive-OR gate Q1, and an output voltage a is at level 0 and passes through the AND gate Q2; the voltage at e is also 0; D2 is turned off; the output of U1, that is, the voltage at b, is 1; at this time, D1 is turned on, so the level of the voltage at d is also high level 1, so the output voltage is at high level 1. When the period is at the position θ, the input ref is 0, and the input in is 1. Similarly, the output a of Q1 is 1, b is 1, D2 is turned on, and D1 is turned off. At this time, the voltage on C4 is quickly discharged through R4, C3, and D2. Since the resistance value of R4 is small, the output quickly becomes 0, which is the same as the ref voltage. Similarly, during the period n, the voltage at b is 0, the voltage at c is 0, and D1 is turned off; the voltage at a and the voltage at b are both 0; D2 is turned off; the voltage of C4 remains 0; the output voltage is always 0 at a low level, which is also equal to that of ref. In conclusion, the output out is exactly the same as the waveform of ref, so pulse in is corrected to the same phase state as that of ref.

When θ is less than 0, that is, when pulse in is ahead of ref, the same can be obtained. During the period m, the same is as the above. The input and the output are both at high level 1. In the period θ, the voltage at b is 0; the voltage at c is 1; D1 is turned on; the voltage at e is 0; and D2 is turned off. At this time, C4 is discharged through D1 and R2. Due to the large resistance value of R2, the discharge is very slow, and C4 will remain at a high level for a period of time. At this time, the output out and ref are equal, which are both at a high level, and the phase is corrected. Until the period n, C4 discharge is completed, and the voltage becomes a low level 0. At this time, the output out is also equal to ref. The phase of the entire pulse in is corrected to be equal to ref.

In some other implementations of the embodiments of the present invention, in order to achieve a voltage follow-up effect, the corrected actual transmission signal is a low output impedance, and the signal phase correction module 2 may further include a second voltage operational amplifier U2. A negative electrode of the second voltage operational amplifier U2 is connected to one end of the third capacitor C3 and the source of the first switch transistor D1, and a positive electrode of the second voltage operational amplifier U2 is connected to the source of the second switch transistor D1, the fourth capacitor C4, and the fourth resistor R4; and an output end of the second voltage operational amplifier U2 is connected to the drain of the first switch transistor D1 to serve as an output end to output the self-correction transmission signal.

As an optional implementation, in order to prevent the output signal from being affected by other signals, the signal phase correction module 2 may further include a fifth capacitor C5 for direct-current-blocking amplification. One end of the fifth capacitor C5 is connected to the third capacitor C3, the source of the first switch transistor D1, and the negative electrode of the second voltage operational amplifier U2, and the other end of the fifth capacitor C5 is connected to the output end of the second voltage operational amplifier U2 and the drain of the first switch transistor D1.

As another optional implementation, in order to prolong the service life of the circuit and protect circuit components from being damaged by excessive high current, the signal phase correction module 2 may further include a first resistor R1 and a third resistor R3. One end of the first resistor R1 is connected to the output end of the trigger signal operation module 1, and the other end of the first resistor R1 is connected to a gate of the first switch transistor D1; and one end of the third resistor R3 is connected to the input end of the trigger signal operation module 1, and the other end of the third resistor R3 is connected to a gate of the second switch transistor D2.

In order to make the technical solutions of the present application clearer to those skilled in the art, the present application further provides a schematic example, which uses the phase self-correction circuit shown in FIG. 3 to perform phase self-correction, where VCC is 3.3 V; C1, C2, C3, and C4 are 1 Uf; R4 is 1 K; R1, R2, and R3 can be 10 K; and R2 can select an appropriate resistance value according to actual circuit needs. C5 is 0.47 Uf, which achieves the direct-current-blocking amplification on the input. U1 and U2 are ordinary LM307 operational amplifiers; D1 and D2 are SI2302 NMOS transistors; Q1 is a 7486 exclusive-OR gate; and Q2 is a 7408 AND gate. The following content can be included:

When θ is greater than 0, that is, in the state shown in FIG. 3, in the period m, ref and in are both at 3.3 V, high level. At this time, the voltage at a is 0; the voltage at e is 0; D2 is turned off; the voltage at b is 3.3 V; the voltage at c is 3.3 V; D1 is turned on; the voltage at d is 3.3 V; a forward input of U2 is 3.3 V, so the output out is 3.3 V, which is equal to the voltage of ref. In the period θ, in is 3.3 V, and ref is 0 V, a=b=3.3 V, so e is equal to 3.3 V, and D2 is turned on; c is equal to 0 V, and D1 is turned off. Therefore, the voltage of terminal d is quickly discharged through R4, C3, and D2, and becomes 0 V. At this time, the output voltage is equal to ref, which is 0 V. In the period n, ref is 0 V, and in is 0 V, a=e=0 V; D2 is turned off, and similarly, D1 is turned off. At this time, the output voltage still remains 0 v, which is equal to ref. In summary, during this period, the output voltage is equal to ref, and the phase is corrected.

When θ is less than 0, that is, the phase of in is ahead of the phase of ref. In the period m, ref and in are both 3.3 V. At this time, the same as the above, the output voltage is 3.3 V, which is equal to ref. In the period θ, in is 0 V, and ref is 3.3 V; the voltage at a is 3.3 V; the voltage at b is 0 V; the voltage at e is 0 V; D2 is turned off, and similarly, D1 is turned on. At this time, d is discharged through D1 and R2. Since the resistance value of R2 is large, the high level will remain for a long time. Until the period n, the voltage becomes 0 V, but in the period θ, the output voltage is still 3.3 V, which is equal to ref. During the period n, ref=in=0

V, the voltage discharge at d is completed, and the voltage becomes 0 V; and at this time, out is 0 v, which is equal to ref. For the entire period interval, out is equal to ref, so in is corrected to ref.

It can be seen from the above that no matter in is ahead of or lags behind ref, the final output signal is corrected to ref, which realizes the self-correction function, without using a special integrated chip circuit or device for phase correction and adjustment. The universality is high, and the reliability is high. The manufacturing cost is greatly saved.

All the embodiments in this specification are described in a progressive manner. Contents mainly described in each embodiment are different from those described in other embodiments. Same or similar parts of all the embodiments refer to each other. For the device disclosed in the embodiments, since it corresponds to the method disclosed in the embodiments, the description is relatively simple, and the relevant part can be referred to the description of the method part.

The skilled person may further realize that the units and algorithmic steps of each example described in conjunction with the embodiments disclosed herein are capable of being implemented in electronic hardware, computer software, or a combination of both, and that the composition and steps of each example have been described generally by function in the above description for the purpose of clearly illustrating the interchangeability of hardware and software. Whether these functions are performed in hardware or software depends on the particular application and design constraints of the technical solution. The skilled person may use different methods to implement the described functions for each particular application, but such implementation should not be considered as going beyond the scope of the present invention.

The above describes the phase self-correction circuit provided by the present application in detail. Specific examples are applied in this specification to illustrate the principle and embodiments of the present invention, and the above description of the embodiments is only used to help understand the method of the present invention and the core idea thereof. It should be noted that for a person of ordinary skill in the art, several improvements and modifications can be made to the present invention without departing from the principle of the present application, and these improvements and modifications also fall within the scope of protection of the claims of the present application.

The invention claimed is:

1. A phase self-correction circuit, comprising a trigger signal operation module and a signal phase correction module, wherein the trigger signal operation module and the signal phase correction module both comprise a plurality of discrete components;
wherein the trigger signal operation module is configured to perform a logical operation on an input phase standard reference signal and actual transmission signal, to obtain a target trigger signal for triggering the signal phase correction module; and
the signal phase correction module is configured to output, based on trigger modes of the target trigger signal and the actual transmission signal, a self-correction transmission signal with a same waveform as that of the phase standard reference signal, to realize phase self-correction on the actual transmission signal.

2. The phase self-correction circuit of claim 1, wherein the trigger signal operation module comprises an exclusive-OR gate and an AND gate;
wherein a first input end of the exclusive-OR gate is connected to the phase standard reference signal, and a second input end of the exclusive-OR gate is connected to the actual transmission signal; a first input end of the AND gate is connected to an output end of the exclusive-OR gate, and a second input end of the AND gate is connected to the actual transmission signal; and an output end of the AND gate is connected to the signal phase correction module.

3. The phase self-correction circuit of claim 2, wherein the trigger signal operation module further comprises a first voltage operational amplifier;
a positive electrode of the first voltage operational amplifier is connected to the actual transmission signal, and an output end of the first voltage operational amplifier is connected to the second input end of the AND gate, to input the actual transmission signal to the AND gate after the actual transmission signal is processed by the first voltage operational amplifier.

4. The phase self-correction circuit of claim 3, wherein the trigger signal operation module further comprises a first capacitor and a second capacitor;
the phase standard reference signal is input to the first input end of the exclusive-OR gate via the first capacitor; and the actual transmission signal is input to the positive electrode of the first voltage operational amplifier via the second capacitor.

5. The phase self-correction circuit of claim 4, wherein the signal phase correction module comprises a first switch transistor, a second switch transistor, and a voltage retention sub-module;
one end of the first switch transistor is connected to an output end of the trigger signal operation module; a second end of the first switch transistor is connected to the voltage retention sub-module; one end of the second switch transistor is connected to the actual transmission signal, and a second end of the second switch transistor is connected to the voltage retention sub-module; and
the voltage retention sub-module is configured to adjust, based on the on and off states of the first switch transistor or the second switch transistor, an output voltage and a voltage of the phase standard reference signal to be consistent so that a waveform of the actual transmission signal is adjusted to be the same as that of the phase standard reference signal, and output the actual transmission signal.

6. The phase self-correction circuit of claim 2, wherein the signal phase correction module comprises a first switch transistor, a second switch transistor, and a voltage retention sub-module;
one end of the first switch transistor is connected to an output end of the trigger signal operation module; a second end of the first switch transistor is connected to the voltage retention sub-module; one end of the second switch transistor is connected to the actual transmission signal, and a second end of the second switch transistor is connected to the voltage retention sub-module; and
the voltage retention sub-module is configured to adjust, based on the on and off states of the first switch transistor or the second switch transistor, an output voltage and a voltage of the phase standard reference signal to be consistent so that a waveform of the actual transmission signal is adjusted to be the same as that of the phase standard reference signal, and output the actual transmission signal.

7. The phase self-correction circuit of claim 3, wherein the signal phase correction module comprises a first switch transistor, a second switch transistor, and a voltage retention sub-module;
  one end of the first switch transistor is connected to an output end of the trigger signal operation module; a second end of the first switch transistor is connected to the voltage retention sub-module; one end of the second switch transistor is connected to the actual transmission signal, and a second end of the second switch transistor is connected to the voltage retention sub-module; and
  the voltage retention sub-module is configured to adjust, based on the on and off states of the first switch transistor or the second switch transistor, an output voltage and a voltage of the phase standard reference signal to be consistent so that a waveform of the actual transmission signal is adjusted to be the same as that of the phase standard reference signal, and output the actual transmission signal.

8. The phase self-correction circuit of claim 1, wherein the signal phase correction module comprises a first switch transistor, a second switch transistor, and a voltage retention sub-module;
  one end of the first switch transistor is connected to an output end of the trigger signal operation module; a second end of the first switch transistor is connected to the voltage retention sub-module; one end of the second switch transistor is connected to the actual transmission signal, and a second end of the second switch transistor is connected to the voltage retention sub-module; and
  the voltage retention sub-module is configured to adjust, based on the on and off states of the first switch transistor or the second switch transistor, an output voltage and a voltage of the phase standard reference signal to be consistent so that a waveform of the actual transmission signal is adjusted to be the same as that of the phase standard reference signal, and output the actual transmission signal.

9. The phase self-correction circuit of claim 8, wherein the first switch transistor and the second switch transistor are both N-type metal oxide semiconductor (NMOS) field-effect transistors.

10. The phase self-correction circuit of claim 9, wherein the voltage retention sub-module comprises a third capacitor, a fourth capacitor, a second resistor, and a fourth resistor;
  two ends of the third capacitor are respectively connected to a source of the first switch transistor and one end of the fourth resistor; one end of the fourth capacitor is connected to a source of the second switch transistor and the fourth resistor; a second end of the fourth capacitor is grounded; and two ends of the second resistor are respectively connected to a drain of the second switch transistor and the trigger signal operation module; and
  a resistance value of the second resistor is determined based on a cycle of the phase standard reference signal or the actual transmission signal and a capacitance of the fourth capacitor, so that a total time of one discharge of the fourth capacitor is not less than a cycle value; and a resistance value of the fourth resistor is not greater than a preset resistance threshold.

11. The phase self-correction circuit of claim 10, wherein the signal phase correction module further comprises a second voltage operational amplifier;
  a negative electrode of the second voltage operational amplifier is connected to one end of the third capacitor and the source of the first switch transistor, and a positive electrode of the second voltage operational amplifier is connected to the source of the second switch transistor, the fourth capacitor, and the fourth resistor; and an output end of the second voltage operational amplifier is connected to a drain of the first switch transistor to serve as an output end to output the self-correction transmission signal.

12. The phase self-correction circuit of claim 11, wherein the signal phase correction module further comprises a fifth capacitor for direct-current-blocking amplification;
  one end of the fifth capacitor is connected to the third capacitor, the source of the first switch transistor, and the negative electrode of the second voltage operational amplifier, and a second end of the fifth capacitor is connected to the output end of the second voltage operational amplifier and the drain of the first switch transistor.

13. The phase self-correction circuit of claim 12, wherein the signal phase correction module further comprises a first resistor and a third resistor;
  one end of the first resistor is connected to the output end of the trigger signal operation module, and a second end of the first resistor is connected to a gate of the first switch transistor; and one end of the third resistor is connected to an input end of the trigger signal operation module, and a second end of the third resistor is connected to a gate of the second switch transistor.

* * * * *